(12) United States Patent
Goto et al.

(10) Patent No.: US 10,673,408 B2
(45) Date of Patent: Jun. 2, 2020

(54) RESONANCE DEVICE

(71) Applicant: Murata Manufacturing Co., Ltd., Nagaokakyo-shi, Kyoto-fu (JP)

(72) Inventors: Yuichi Goto, Nagaokakyo (JP); Wakana Hirota, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 492 days.

(21) Appl. No.: 15/450,161

(22) Filed: Mar. 6, 2017

(65) Prior Publication Data
US 2017/0187351 A1  Jun. 29, 2017

Related U.S. Application Data

(63) Continuation of application No. PCT/JP2015/076690, filed on Sep. 18, 2015.

(30) Foreign Application Priority Data

Sep. 29, 2014 (JP) ................. 2014-199030

(51) Int. Cl.
*H03H 9/10* (2006.01)
*H03H 9/21* (2006.01)
(Continued)

(52) U.S. Cl.
CPC ......... *H03H 9/2447* (2013.01); *B06B 1/0603* (2013.01); *H03H 3/0072* (2013.01);
(Continued)

(58) Field of Classification Search
CPC .. H03H 9/2447; H03H 9/1057; H03H 9/2489; H03H 2009/02299; B06B 1/0603
See application file for complete search history.

(56) References Cited

U.S. PATENT DOCUMENTS 5,824,900 A * 10/1998 Konno ............... G01C 19/5607
73/504.16
6,898,832 B2  5/2005 Kawashima
(Continued)

FOREIGN PATENT DOCUMENTS

JP  2003-204240 A  7/2003
JP  2010-136243 A  6/2010
(Continued)

OTHER PUBLICATIONS

International Search Report issued International Application No. PCT/JP2015/076690, dated Oct. 27, 2015.
(Continued)

*Primary Examiner* — J. San Martin
(74) *Attorney, Agent, or Firm* — Arent Fox LLP

(57) ABSTRACT

A resonance device is provided with a reduced size and also suppresses the occurrence of deformation and breakage during operation. The resonance device includes a lower substrate, an upper substrate that defines a vibration space between the lower substrate and the upper substrate, a protruding portion that is formed on an inner surface of the lower or upper substrates. Moreover, a resonator is disposed in the vibration space and includes a base portion and vibration arms that extend in parallel to one another from the base portion along the inner surface of the lower substrate or the inner surface of the upper substrate and that vibrate in a vertical direction toward the inner surface of the lower substrate or the inner surface of the upper substrate.

17 Claims, 13 Drawing Sheets

(51) Int. Cl.
*H03H 9/24* (2006.01)
*H03H 3/007* (2006.01)
*B06B 1/06* (2006.01)
*H03H 9/02* (2006.01)

(52) U.S. Cl.
CPC ........ *H03H 9/1057* (2013.01); *H03H 9/2489* (2013.01); *H03H 2009/02299* (2013.01)

(56) References Cited

U.S. PATENT DOCUMENTS

| | | | | |
|---|---|---|---|---|
| 8,053,952 | B2* | 11/2011 | Takahashi | H03H 9/1021 310/312 |
| 8,212,454 | B2* | 7/2012 | Onitsuka | G04R 20/10 310/348 |
| 8,310,317 | B2 | 11/2012 | Yamada | |
| 8,359,922 | B2* | 1/2013 | Oguri | G01C 19/5607 73/504.16 |
| 8,456,065 | B2* | 6/2013 | Amano | H03H 9/0595 310/344 |
| 8,803,407 | B2* | 8/2014 | Kawase | H03H 9/0519 310/344 |
| 8,810,327 | B2 | 8/2014 | Yamada | |
| 2003/0080652 | A1 | 5/2003 | Kawashima | |
| 2003/0168943 | A1* | 9/2003 | Matsuyama | H03H 9/1021 310/344 |
| 2009/0015106 | A1* | 1/2009 | Tanaya | H03H 9/0595 310/344 |
| 2010/0148634 | A1* | 6/2010 | Ichikawa | H01L 41/053 310/348 |
| 2011/0062831 | A1 | 3/2011 | Amano et al. | |
| 2011/0164473 | A1* | 7/2011 | Onitsuka | H03H 9/1021 368/47 |
| 2011/0187470 | A1 | 8/2011 | Yamada | |
| 2013/0038171 | A1 | 2/2013 | Yamada | |

FOREIGN PATENT DOCUMENTS

| | | |
|---|---|---|
| JP | 2011-004213 A | 1/2011 |
| JP | 2011-087274 A | 4/2011 |
| JP | 2011-160250 A | 8/2011 |

OTHER PUBLICATIONS

Written Opinion of the International Searching Authority issued in International Application No. PCT/JP2015/076690, dated Oct. 27, 2015.

* cited by examiner

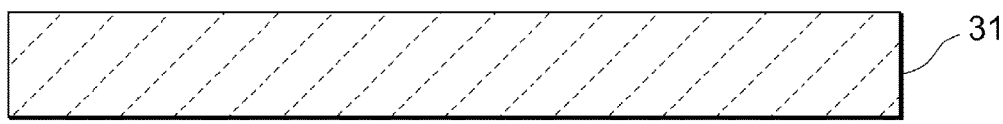
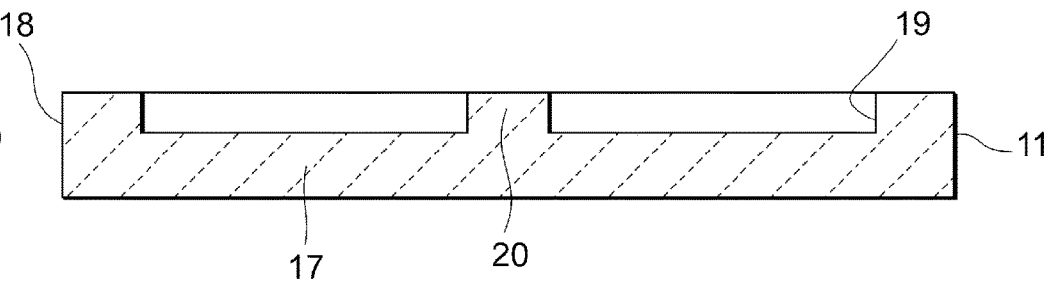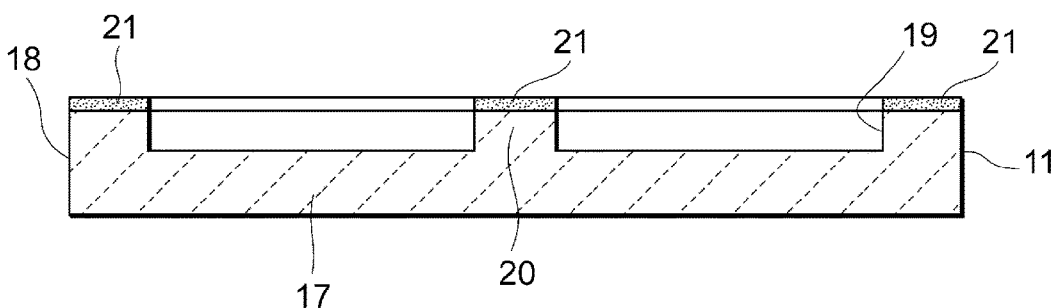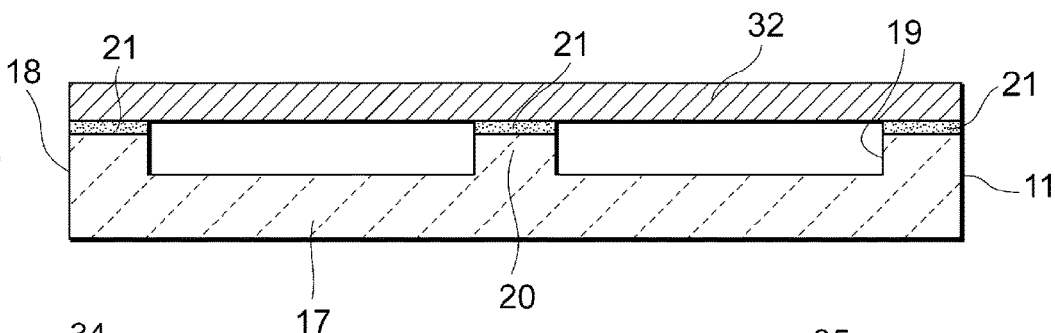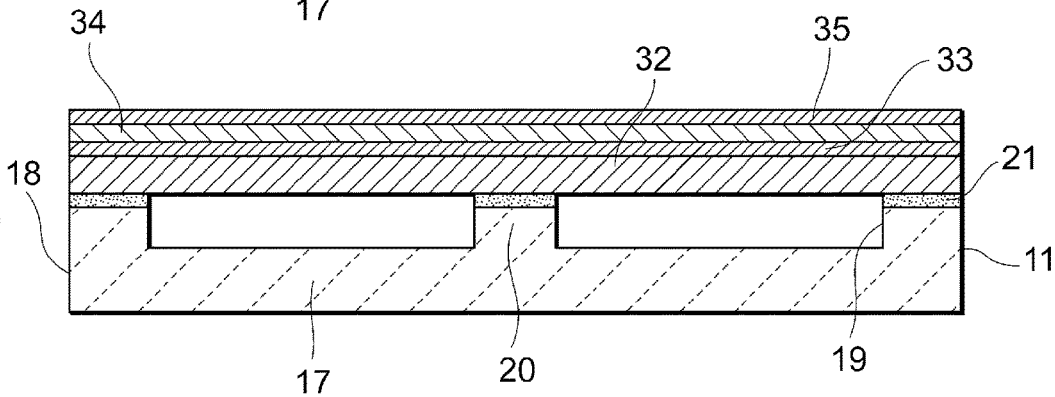

FIG. 8
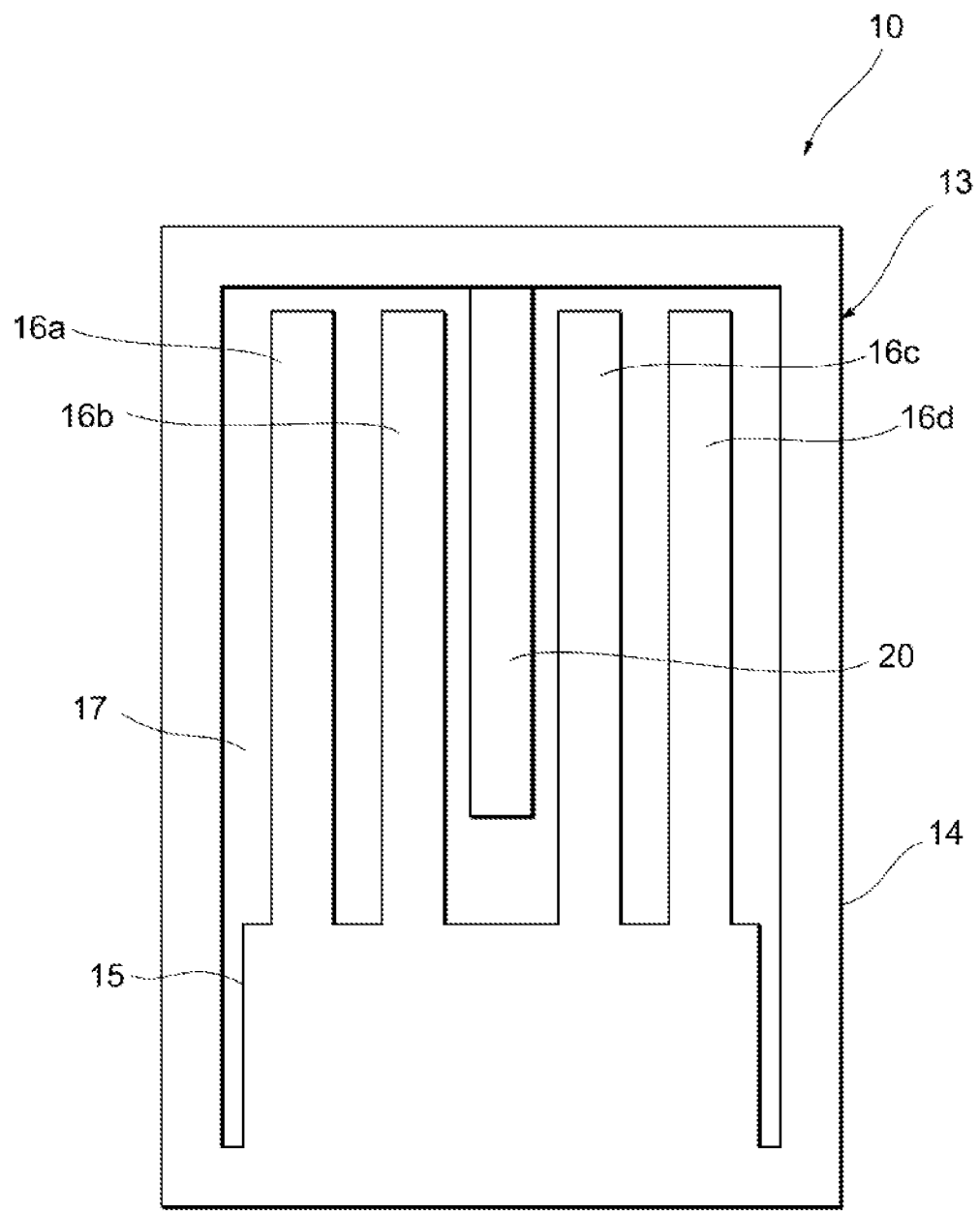
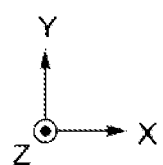

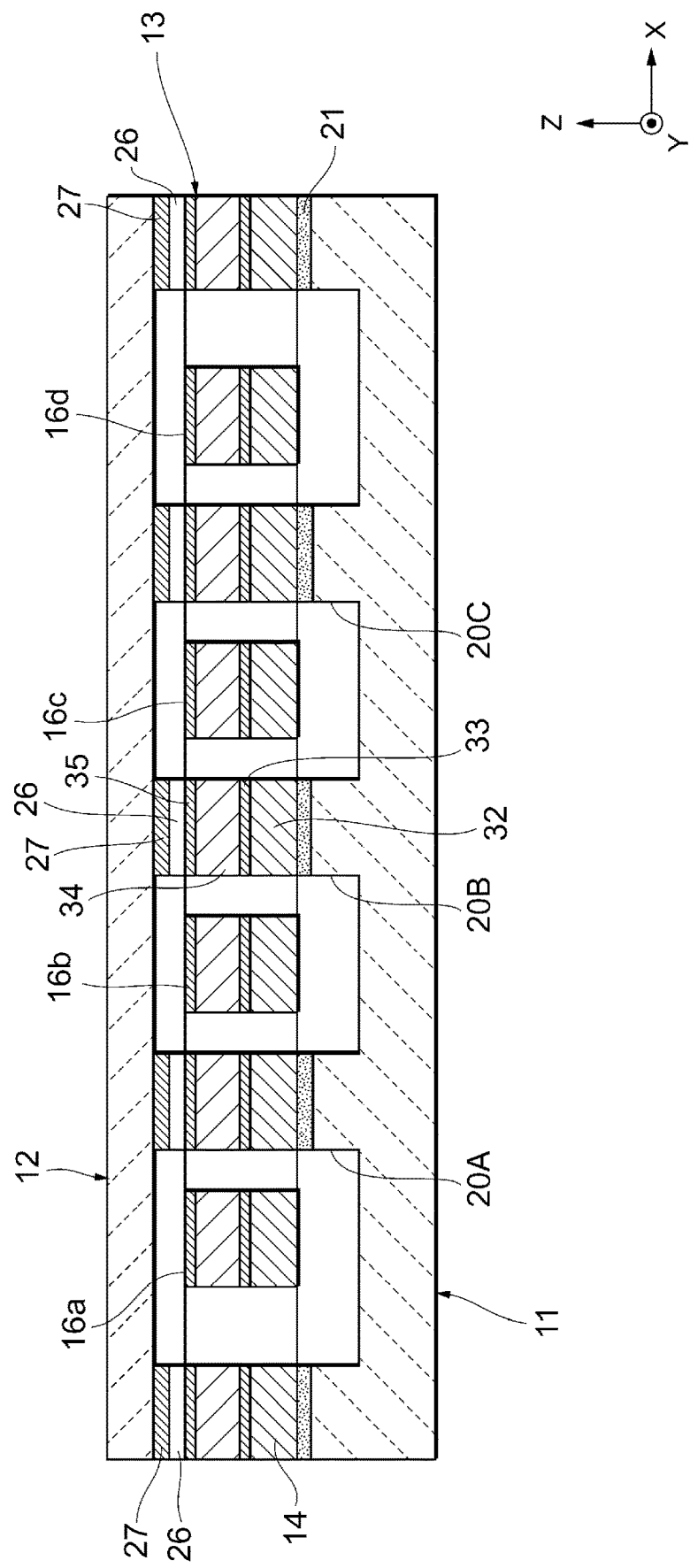

RESONANCE DEVICE

CROSS REFERENCE TO RELATED APPLICATIONS

The present application is a continuation of PCT/JP2015/076690 filed Sep. 18, 2015, which claims priority to Japanese Patent Application No. 2014-199030, filed Sep. 29, 2014, the entire contents of each of which are incorporated herein by reference.

TECHNICAL FIELD

The present disclosure relates to a resonance device in which a plurality of vibration arms vibrate in an out-of-plane bending vibration mode.

BACKGROUND

Currently, resonance devices manufactured using microelectromechanical systems (MEMS) technology have been used as, for example, timing devices. Conventional resonance devices are mounted onto printed wiring boards, which are incorporated into electronic devices such as smartphones. Such a resonance device includes a lower substrate, an upper substrate that defines a cavity between the lower substrate and the upper substrate. Moreover, a resonator is disposed in the cavity between the lower substrate and the upper substrate.

Generally, the conventional resonator includes a base portion extending in the cavity, which is formed between the lower substrate and the upper substrate, and a plurality of vibration arms extending in parallel to one another in the cavity, each of the plurality of vibration arms having a fixed end, which is connected to an end of the base portion, and a free end. Moreover, each of the vibration arms vibrates in the vertical direction toward the lower substrate or the upper substrate in accordance with the orientation of the electric field applied thereto. For example, in a resonator that includes three vibration arms, electric fields oriented in opposite directions are respectively applied to the center vibration arm and the outer vibration arms, and the center vibration arm and the outer vibration arms vibrate with opposite phases.

Patent Document 1: Japanese Unexamined Patent Application Publication No. 2003-204240.

With the recent reduction in the sizes of electronic devices, there has been a demand for a reduction in the sizes of resonance devices, and thus, there is a need to realize a reduction in the size of a resonance device by, for example, reducing the thickness of the resonance device defined by the above-mentioned vertical direction. Accordingly, in order to reduce the thickness of the resonance device while ensuring a sufficient vibration space of the vibration arms, reducing the thicknesses of the lower substrate and the upper substrate may be considered. However, reducing the thicknesses of the substrates leads to a reduction in the rigidity of the substrates. As a result, deformation, such as warpage, may occur in the substrates or that the substrates will break due to an impact generated when an electronic device falls on the ground, for example.

SUMMARY OF THE INVENTION

The present disclosure has been made in light of the above-described situation, and it is an object of the disclosed resonance devices to realize a reduction in the size of a resonance device and to suppress occurrence of deformation and breakage of a resonance device.

Thus, a resonance device according to an aspect of the present disclosure includes a lower substrate, an upper substrate that defines a vibration space between the lower substrate and the upper substrate, and a protruding portion that is formed on an inner surface of the lower substrate or an inner surface of the upper substrate and that protrudes in the vibration space. Moreover, a resonator is disposed in the vibration space and includes a base portion and a plurality of vibration arms that extend in parallel to one another from the base portion along the inner surface of the lower substrate or the inner surface of the upper substrate and that vibrate in a vertical direction toward the inner surface of the lower substrate or the inner surface of the upper substrate.

According to the present disclosure, in a resonance device, a reduction in the size of the resonance device is realized, and occurrence of deformation and breakage is suppressed.

BRIEF DESCRIPTION OF DRAWINGS

FIGS. 5(a) through 5(e) and 6(a) through 6(c) are cross-sectional views illustrating a method of manufacturing the resonance device according to the first embodiment.

FIG. 8 is a plan view schematically illustrating the structure of a resonance device according to a second embodiment.

FIG. 13 is a cross-sectional view schematically illustrating the structure of a resonance device according to a seventh embodiment.

DETAILED DESCRIPTION OF EXEMPLARY EMBODIMENTS

Figure 1:
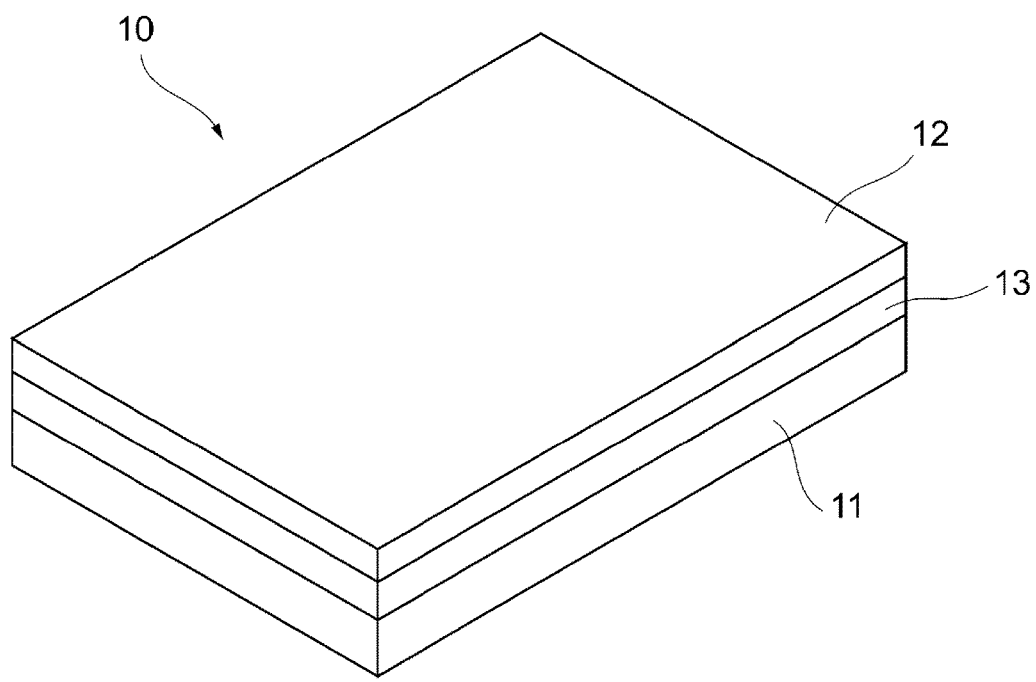
FIG. 1 is a perspective view schematically illustrating the appearance of a resonance device according to a first embodiment.

A first embodiment of the present disclosure will be described below with reference to the accompanying drawings. FIG. 1 is a perspective view schematically illustrating the appearance of a resonance device 10 according to the first embodiment. The resonance device 10 includes a lower substrate 11, an upper substrate 12 that defines a vibration space between the lower substrate 11 and the upper substrate 12. Moreover, a resonator 13 is sandwiched and held between the lower substrate 11 and the upper substrate 12. Preferably, the resonator 13 is a MEMS vibrator manufactured by using the MEMS technology.

Figure 2:
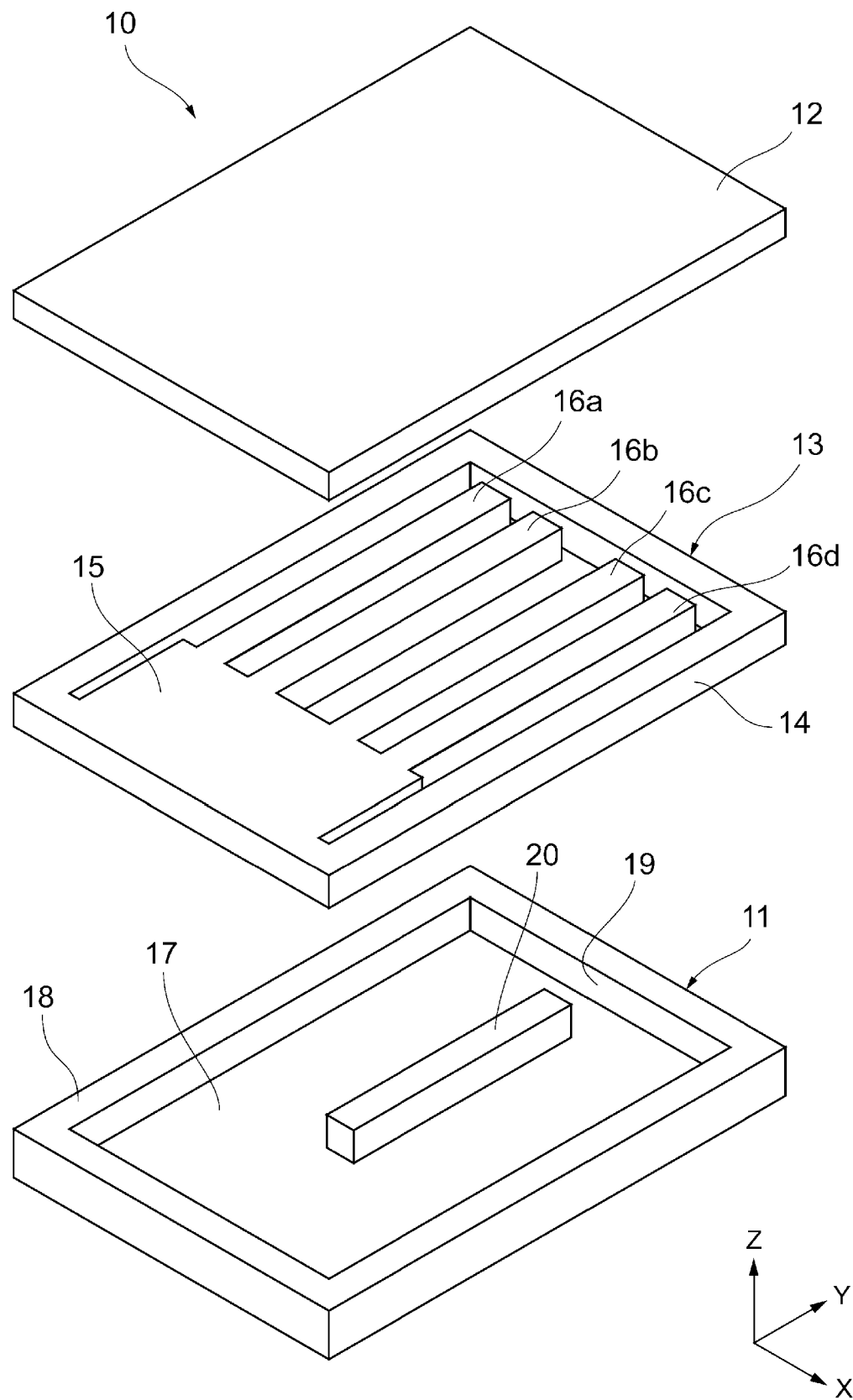
FIG. 2 is an exploded perspective view schematically illustrating the structure of the resonance device according to the first embodiment.

FIG. 2 is an exploded perspective view schematically illustrating the structure of the resonance device 10 according to the first embodiment. As illustrated in FIG. 2, the resonator 13 includes a support frame 14 extending along an XY plane of the rectangular coordinate system of FIG. 2 so as to have a rectangular frame-like shape, a base portion 15 extending from an end of the support frame 14 along the XY plane so as to have a flat plate-like shape in the support frame 14, and a plurality of vibration arms 16a to 16d extending along the XY plane, each of the plurality of vibration arms 16a to 16d having a fixed end, which is connected to an end of the base portion 15, and a free end. In the present embodiment, four vibration arms 16a to 16d extend parallel to the Y-axis. However, it is noted that the number of the vibration arms is not limited to four and may be set to any number that is, for example, four or larger.

Figure 3:
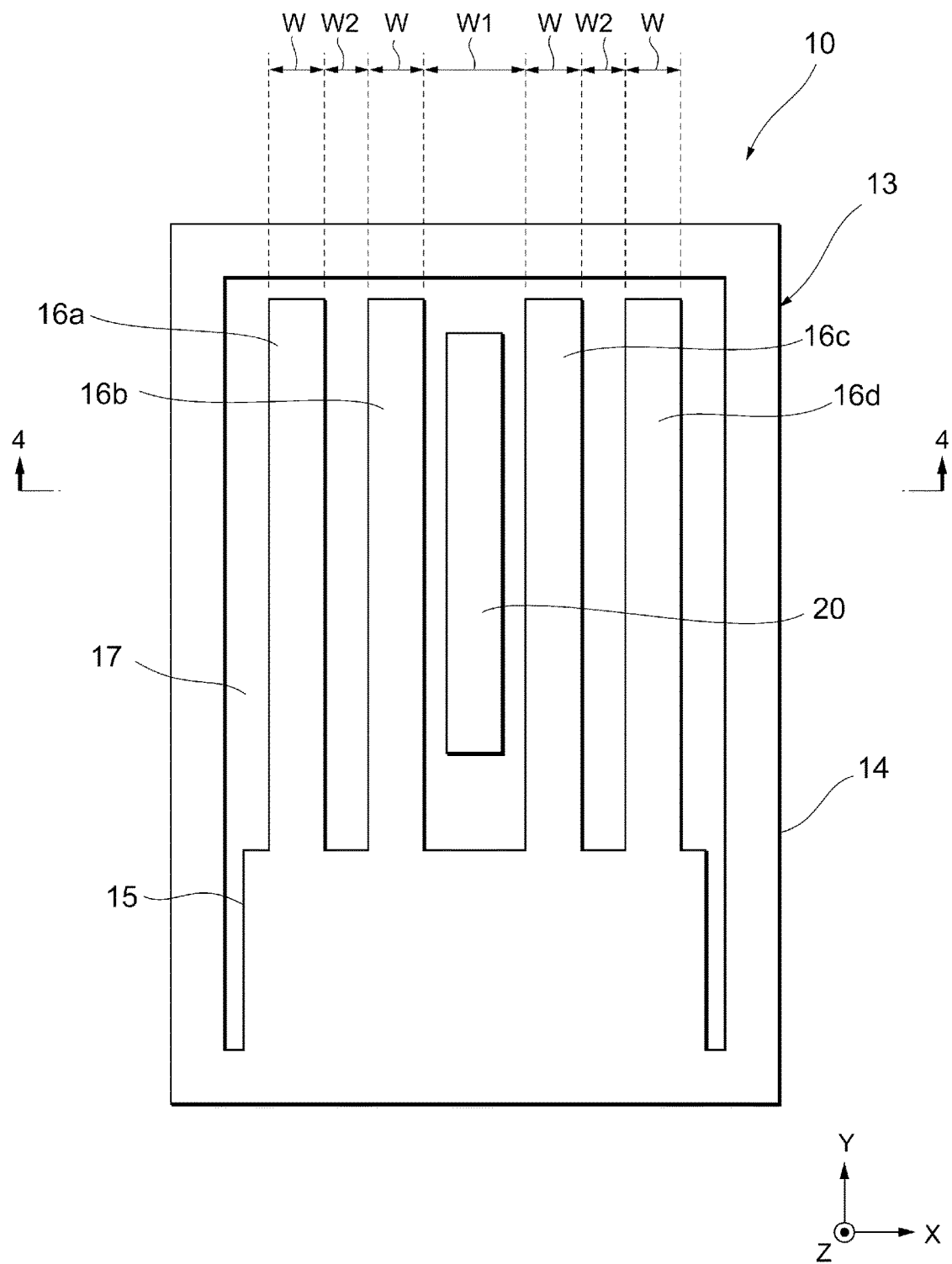
FIG. 3 is a plan view of the resonance device according to the first embodiment of the present invention from which an upper substrate has been removed.

FIG. 3 is a plan view of the resonance device 10 from which the upper substrate 12 has been removed. Referring to FIG. 2 and FIG. 3 together, the vibration arms 16a to 16d are each formed in a rectangular columnar shape and have the same size. As shown in FIG. 3, a gap W1 between the two inner vibration arms 16b and 16c, which are disposed between the two outer vibration arms 16a and 16d in the X-axis direction, the gap W1 being defined by the X-axis direction, is set to be larger than a gap W2 between the outer vibration arm 16a (16d) and the inner vibration arm 16b (16c) that is adjacent to the outer vibration arm 16a (16d), the gap W2 being defined by the X-axis direction.

The lower substrate 11 includes a bottom plate 17 extending along the XY plane so as to have a flat plate-like shape and a side wall 18 standing upright from the peripheral edge portion of the bottom plate 17 in the Z-axis direction. The inner surface of the lower substrate 11, that is, a surface of the bottom plate 17, and the inner surface of the side wall 18 form a recess 19. The recess 19 forms some of the vibration space of the vibration arms 16a to 16d. In the recess 19, a protruding portion 20 protruding in the vibration space is formed on the surface of the bottom plate 17. As shown in FIG. 3, the protruding portion 20 is formed on the bottom plate 17 so as to be located at a position facing the gap between the inner vibration arms 16b and 16c. In the present embodiment, the protruding portion 20 is formed in a rectangular columnar shape extending parallel to the vibration arms 16a to 16d.

Figure 4:
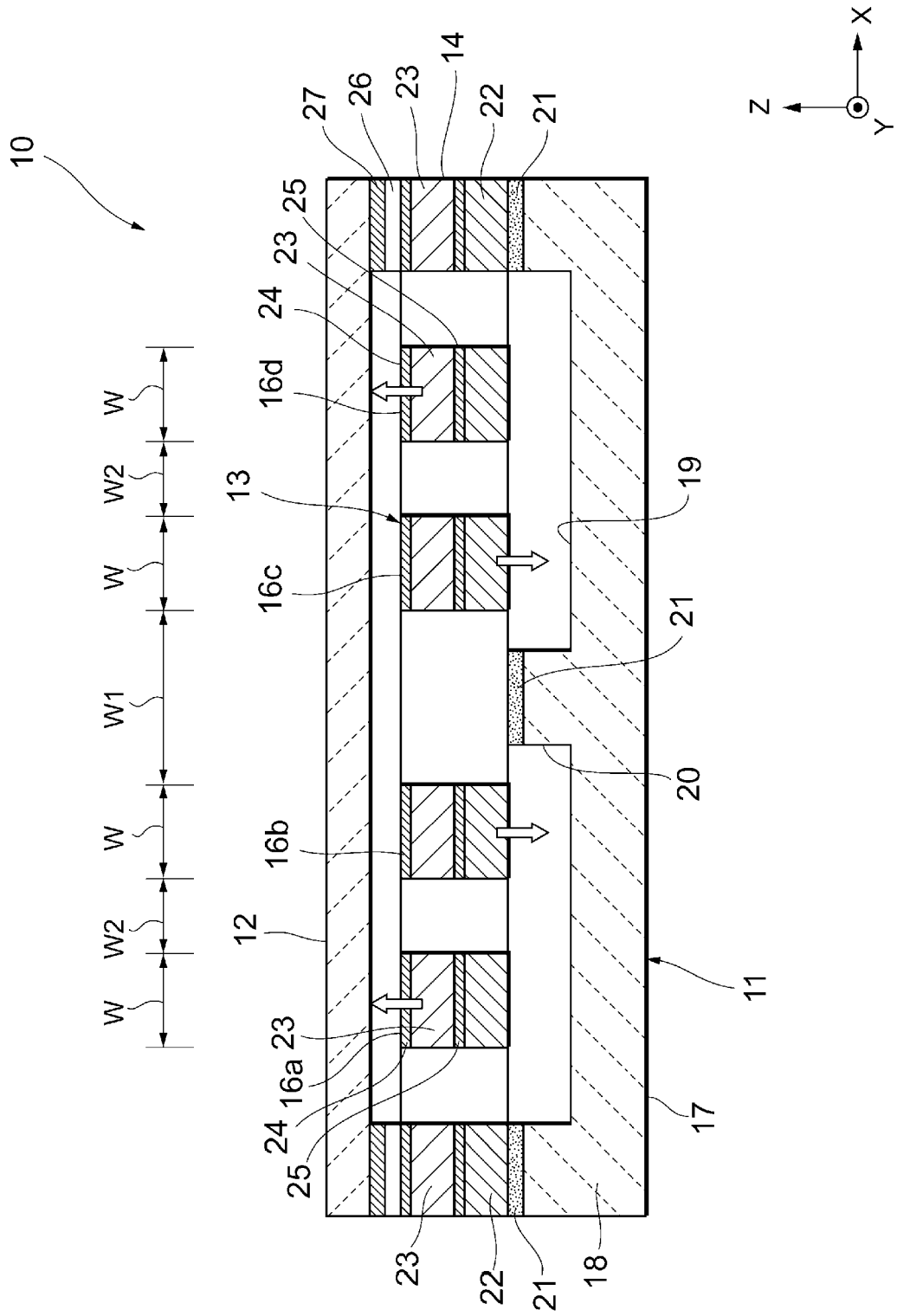
FIG. 4 is a cross-sectional view taken along line 4-4 of FIG. 3.

FIG. 4 is a cross-sectional view taken along line 4-4 of FIG. 3. Referring to FIG. 4 together with FIG. 2 and FIG. 3, in the resonance device 10 according to the present embodiment, the support frame 14 of the resonator 13 is received on the side wall 18 of the lower substrate 11, and the upper substrate 12 is disposed on the resonator 13 so as to cover the resonator 13. As a result, the resonator 13 is held between the lower substrate 11 and the upper substrate 12, and the vibration space of the vibration arms 16a to 16d is defined by the lower substrate 11, the upper substrate 12, and the support frame 14 of the resonator 13. Preferably, the vibration space is airtightly kept, and a vacuum state is maintained. The upper substrate 12 is formed in, for example, a flat plate-like shape.

The bottom plate 17 and the side wall 18 of the lower substrate 11 and the protruding portion 20 are integrally formed of silicon (Si). A silicon oxide (e.g., silicon dioxide (SiO$_2$)) film 21 is formed on the top surface of the side wall 18 and the top surface of the protruding portion 20, and the silicon oxide film 21 is used for joining the lower substrate 11 and the support frame 14 of the resonator 13 to each other. The thickness of the lower substrate 11 defined by the Z-axis direction is set to, for example, 150 µm, and the depth of the recess 19 is set to, for example, 50 µm. The length of the protruding portion 20 defined by the Y-axis direction is set to, for example, about 400 µm. The width of the protruding portion 20 defined by the X-axis direction is set to, for example, about 20 µm. The height of the protruding portion 20 defined by the Z-axis direction is set to, for example, about 50 µm.

In the resonator 13, the support frame 14, the base portion 15, and the vibration arms 16a to 16d are each formed of a silicon (Si) layer 22 and an aluminum nitride (AlN) layer 23 stacked on the Si layer 22. The Si layer 22 is formed of an n-type Si semiconductor, which is a degenerate semiconductor, and may include phosphorus (P), arsenic (As), antimony (Sb), or the like as an n-type dopant. The length of each of the vibration arms 16a to 16d defined by the Y-axis direction is set to, for example, about 500 µm. The width of each of the vibration arms 16a to 16d defined by the X-axis direction is set to, for example, about 50 µm. The thickness of each of the vibration arms 16a to 16d defined by the Z-axis direction is set to, for example, about 6 µm. The gap W1 between the inner vibration arms 16b and 16c is set to, for example, about 30 µm.

Each of the vibration arms 16a to 16d includes first and second molybdenum (Mo) layers 24 and 25 that are respectively formed on the top surface and the bottom surface of the above-mentioned AlN layer 23 so as to sandwich the AlN layer 23 therebetween. The first and second Mo layers 24 and 25 form first and second electrodes. For example, the first and second Mo layers 24 and 25 are connected to an alternating-current power supply (not illustrated) provided outside the resonator 13. When connecting the first and second Mo layers 24 and 25 to the alternating-current power supply, for example, an electrode (not illustrated) formed on the outer surface of the upper substrate 12 and a through-silicon via (TSV) (not illustrated) formed in the upper substrate 12 are used.

The AlN layer 23 is a piezoelectric film that converts a voltage applied thereto into vibration. Instead of the AlN layer 23, for example, a scandium aluminum nitride layer, which is an AlN layer in which some of Al is substituted with Sc, may be used in another aspect. The AlN layer 23 expands and contracts in the in-plane direction of the XY plane, that is, the Y-axis direction, by the first and second Mo layers 24 and 25 in accordance with the electric field applied to the AlN layer 23. The vibration arms 16a to 16d are bent and displaced in the direction perpendicular to the XY plane (the Z-axis direction) in response to the expansion and contraction of the AlN layer 23. In other words, the free ends of the vibration arms 16a to 16d are displaced toward the inner surfaces of the lower and upper substrates 11 and 12, and the vibration arms 16a to 16d vibrate in an out-of-plane bending vibration mode.

In the present embodiment, as shown in FIG. 4, by setting the electric field applied to the outer vibration arms 16a and 16d and the electric field applied to the inner vibration arms 16b and 16c to have opposite phases, the outer vibration arms 16a and 16d and the inner vibration arms 16b and 16c are displaced in opposite directions. For example, when the free ends of the outer vibration arms 16a and 16d are displaced toward the inner surface of the upper substrate 12, the free ends of the inner vibration arms 16b and 16c are displaced toward the inner surface of the lower substrate 11.

The upper substrate 12 is formed of a silicon (Si) member having a predetermined thickness and extending along the XY plane so as to have a flat plate-like shape. As is clear from FIG. 4, the peripheral edge portion of the upper substrate 12 is received on the support frame 14 of the resonator 13. As a result, the upper substrate 12 supports the resonator 13 by sandwiching the support frame 14 of the resonator 13 between the lower substrate 11 and the upper substrate 12. A gold (Au) film 26 and a tin (Sn) film 27, which are used for joining the upper substrate 12 and the support frame 14 to each other, are sandwiched between the peripheral edge portion of the upper substrate 12 and the support frame 14.

According to the above-described resonance device 10, the protruding portion 20 protruding in the vibration space is formed on the inner surface of the lower substrate 11. Advantageously, the rigidity of the lower substrate 11 can be improved compared with conventional designs because of the protruding portion 20, and thus, even if the thickness of the lower substrate 11 is reduced in order to realize a reduction in the size of the resonance device 10, the rigidity of the lower substrate 11 will be equivalent to or higher than that in the case where the thickness of the lower substrate 11 is not reduced. Thus, the occurrence of warpage of the lower substrate 11 can be suppressed, and breakage of the lower substrate 11 due to an electronic device, into which the resonance device 10 is incorporated, falling on the ground can be prevented.

In addition, since the protruding portion 20 is formed on the inner surface of the lower substrate 11 facing the gap between the inner vibration arms 16b and 16c, the protruding portion 20 will not hinder vibration of the vibration arms 16a to 16d. As a result, the amplitude of vibration of the vibration arms 16a to 16b can be secured as is. Furthermore, since the size of the vibration space of the vibration arms 16a to 16d in the vertical direction increases by forming the recess 19 in the lower substrate 11, even if the amplitude of vibration of the vibration arms 16a to 16d is increased, the vibration arms 16a to 16d, the lower substrate 11, and the upper substrate 12 can be prevented from coming into contact with each other. Therefore, stable vibration of the vibration arms 16a to 16d can be realized.

A method of manufacturing the resonance device 10 will now be described below. FIGS. 5(a) through 5(e) and 6(a) through 6(c) are cross-sectional views illustrating the method of manufacturing the resonance device 10 according to the first embodiment. First, as illustrated in FIG. 5(a), a Si substrate 31 having a flat plate-like shape is prepared. Next, as illustrated in FIG. 5(b), the recess 19 having a predetermined depth is formed in the flat top surface of the Si substrate 31 by, for example, etching. At the same time as the recess 19 is formed, the protruding portion 20 is formed, and the lower substrate 11 is formed. The height of the protruding portion 20 from the top surface of the bottom plate 17 is equal to the height of the side wall 18 from the top surface of the bottom plate 17.

After that, as illustrated in FIG. 5(c), the silicon oxide joining film 21 is patterned onto the top surface of the side wall 18 and the top surface of the protruding portion 20. Then, as illustrated in FIG. 5(d), a degenerate Si substrate 32 having a flat plate-like shape is joined to the silicon oxide film 21 by, for example, eutectic bonding. Subsequently, as illustrated in FIG. 5(e), a first Mo film 33, an AlN film 34, and a second Mo film 35 are sequentially deposited on the degenerate Si substrate 32 by, for example, sputtering. In this case, the first Mo film 33 and the second Mo film 35 do not need to be formed on the entire top surface of the degenerate Si substrate 32 and may be formed only in, for example, a region including the positions at which the first and second electrodes are formed.

Figure 6A:
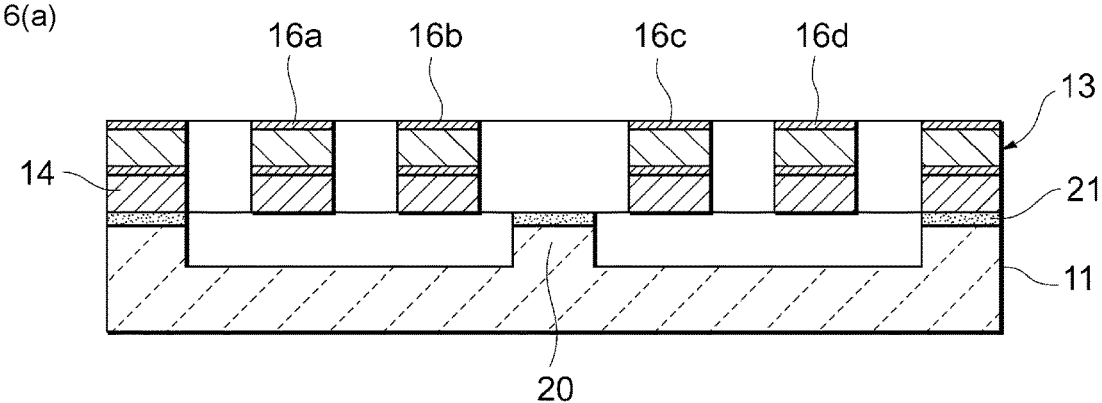
Figure 6B:
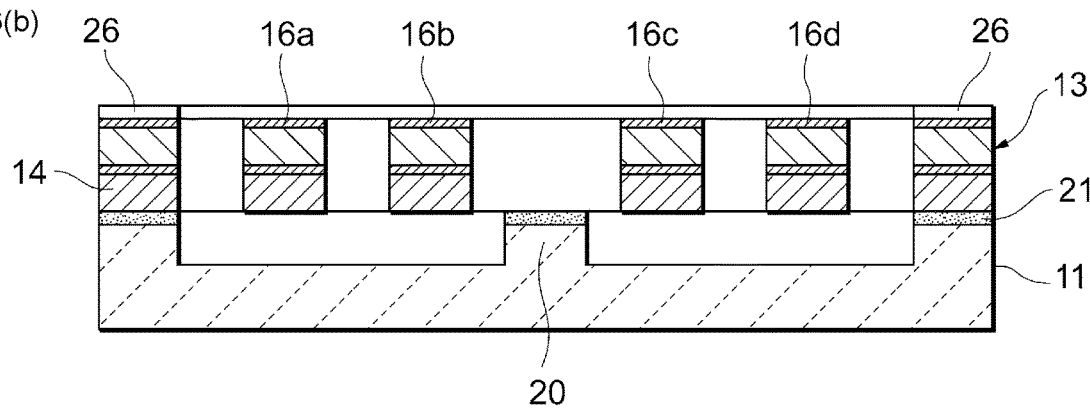

After that, as illustrated in FIG. 6(a), the shapes of the support frame 14, the base portion 15, and the vibration arms 16a to 16d, which have been described above, are defined by, for example, performing dry etching or wet etching on the degenerate Si substrate 32, the first Mo film 33, the AlN film 34, and the second Mo film 35. As a result, the resonator 13, which is supported on the side wall 18 of the lower substrate 11 by the support frame 14, is formed. Subsequently, as illustrated in FIG. 6(b), the Au joining film 26 is deposited on the top surface of the support frame 14, which is a portion where the upper substrate 12 and the support frame 14 are joined to each other.

Figure 6C:
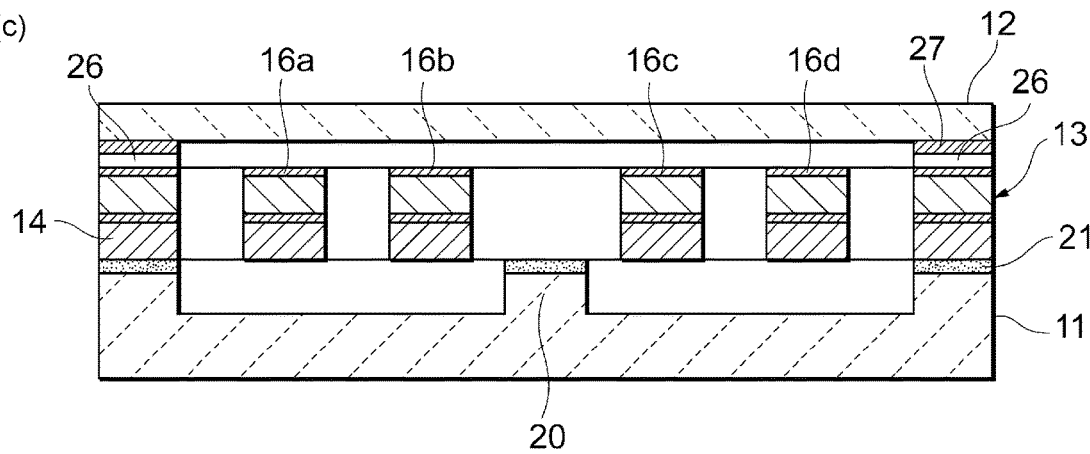

Meanwhile, the upper substrate 12 is prepared. As illustrated in FIG. 6(c), the Sn film 27 is deposited beforehand by, for example, sputtering on the portion where the upper substrate 12 and the support frame 14 are joined to each other. By joining the Sn film 27 to the Au film 26 on the support frame 14, the upper substrate 12 is joined to the support frame 14. As a result, the lower substrate 11, the resonator 13, and the upper substrate 12 define the vibration space of the vibration arms 16a to 16d. In this case, the vibration space is airtightly maintained in a vacuum state. Accordingly, the exemplary resonance device 10 described herein can be manufactured in the manner described above.

The inventors of the present application verified the relationship between the gaps W1 and W2 between the vibration arms 16a to 16d, which are adjacent to one another, and $k^2Q$ that represents vibration performance. In the vibration arms 16a to 16d, the thickness of the Si layer 22 was set to 10 μm. The thickness of each of the first and second Mo layers 24 and 25 was set to 0.1 μm. The thickness of the AlN layer 23 was set to 0.8 μm. It is noted that a silicon oxide layer having a thickness of 1.5 μm was formed on the Si layer 22. In the rectangular coordinate axis of FIG. 3, the length of each of the vibration arms 16a to 16d defined by the Y-axis direction was set to 650 μm, and the width W of each of the vibration arms 16a to 16d defined by the X-axis direction was set to 30 μm.

Figure 7:
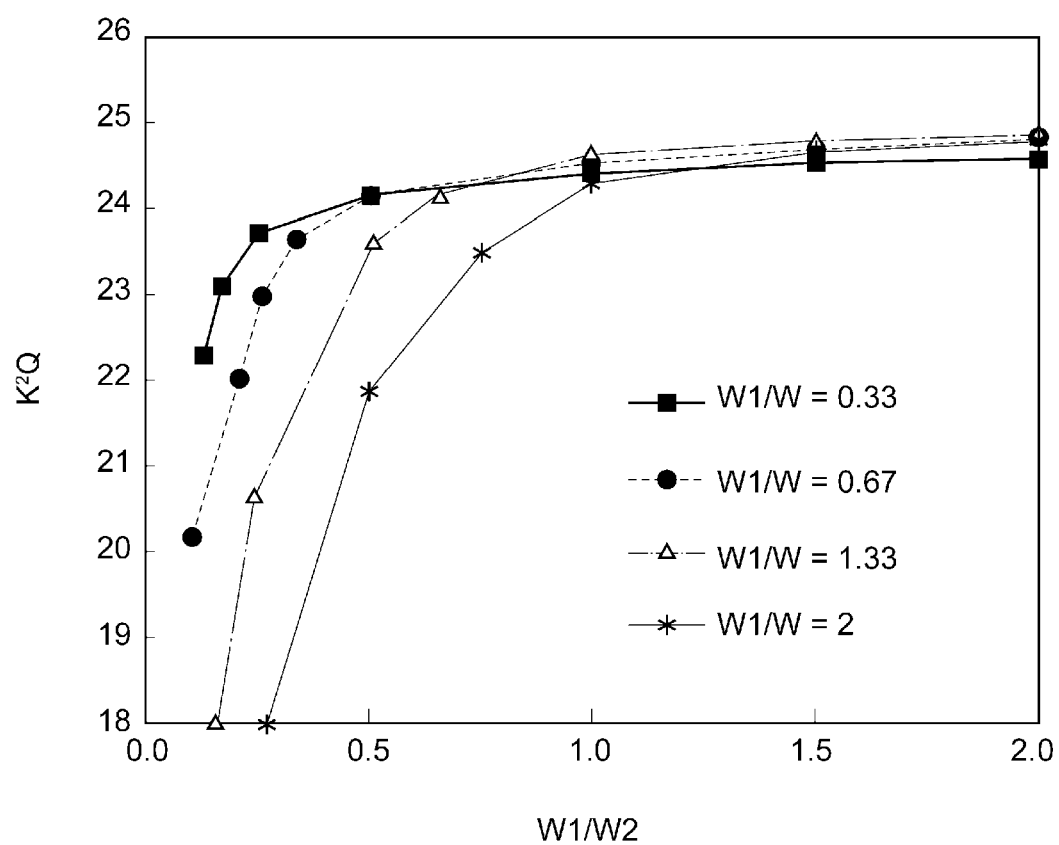
FIG. 7 is a graph denoting the relationship between ratios of the gap between inner vibration arms to the gap between one of outer vibration arms and a corresponding one of the inner vibration arms and $k^2Q$.

The relationship between the ratio of the gap W1 to the gap W2 (W1/W2) and $k^2Q$ when the ratio of the gap W1 to the width w (W1/W) was varied was measured under the above conditions. As a result, as illustrated in FIG. 7, it was confirmed that $k^2Q$ was relatively improved when the value of W1/W2 was set to 0.5 or larger regardless of the value of W1/W. In particular, it was confirmed that $k^2Q$ was stably improved when the value of W1/W2 was set to 1.0 or larger. That is to say, it was confirmed that the vibration performance was further improved when the gap W2 was set to be equal to or larger than the gap W1.

According to the verification test results, since the gap W1 is set to be larger than the gap W2 in the above-described resonance device 10 according to the first embodiment, the vibration performance is relatively improved. In this case, by setting the gap W2 to be larger than it used to be, the width of the resonance device 10 defined by the X-axis direction increases. In this case, it is assumed that the widths of the lower substrate 11 and the upper substrate 12 increase, which in turn leads to a reduction in the rigidity of the lower substrate 11 and the upper substrate 12. The present disclosed resonance device is particularly useful for solving a problem that occurs due to a reduction in the rigidity of the lower substrate 11 and the upper substrate 12.

FIG. 8 is a plan view schematically illustrating the structure of a resonance device 10 according to a second embodiment of the present disclosure. It is noted that, in the second embodiment and the subsequent embodiments, description of a configuration that is common to the first embodiment will be omitted, and only differences from the first embodiment will be described. In particular, similar advantageous effects obtained in similar configurations will not be described in every embodiment. As illustrated in FIG. 8, similar to the first embodiment, the protruding portion 20 is formed so as to extend in the Y-axis direction on the inner surface of the lower substrate 11 facing the gap between the inner vibration arms 16b and 16c. In the second embodiment, an end of the protruding portion 20 is connected to a portion of the side wall 18, which is an end portion of the lower substrate 11. According to the above configuration, as a result of the protruding portion 20 and the side wall 18 being connected to each other, the rigidity of the lower substrate 11 can be further improved.

Figure 9:
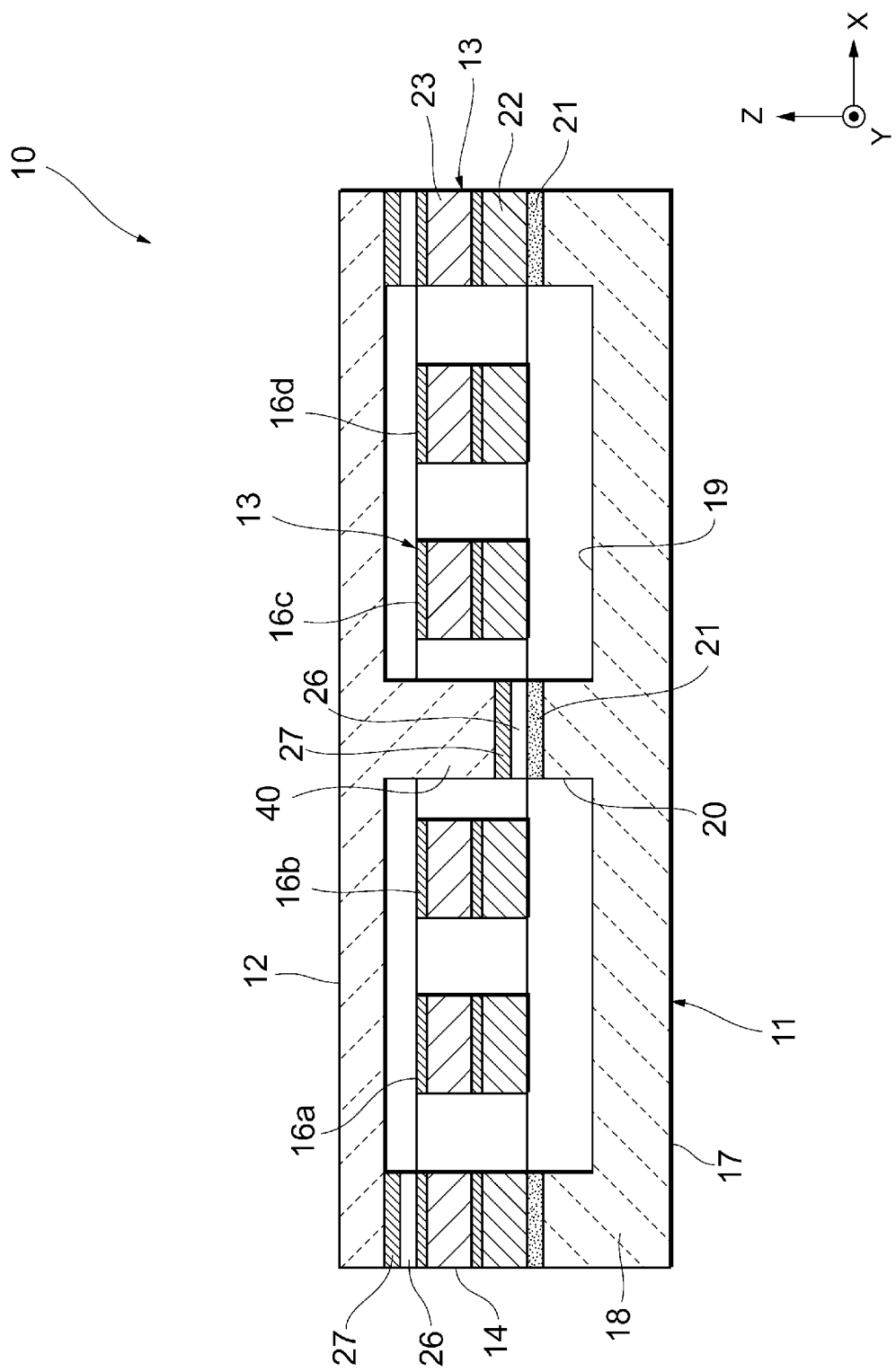
FIG. 9 is a cross-sectional view schematically illustrating the structure of a resonance device according to a third embodiment.

FIG. 9 is a cross-sectional view schematically illustrating the structure of a resonance device 10 according to a third embodiment. As illustrated in FIG. 9, in addition to the protruding portion 20 of the lower substrate 11, a protruding portion 40 may be formed on the inner surface of the upper substrate 12. Similar to the protruding portion 20, the protruding portion 40 is formed in a rectangular columnar shape extending in the Y-axis direction. In the present embodiment, the protruding portion 40 is formed on the upper substrate 12 so as to be located at a position facing the protruding portion 20, and the protruding portion 40 is connected to the protruding portion 20. Thus, the protruding portion 40 enters the gap between the inner vibration arms 16b and 16c.

As is clear from FIG. 9, it is desirable that the protruding portion 20 and the protruding portion 40 be joined to each other by the Au joining film 26 and the Sn joining film 27. In the structure according to the second embodiment, a protruding portion is formed on both the lower substrate 11 and the upper substrate 12, and thus, the rigidity of the substrates can be further improved. Note that the protruding portion 20 and the protruding portion 40 do not need to be formed at positions where they exactly face each other in the Z-axis direction and may face each other at positions where they are displaced from each other, and a portion of the protruding portion 20 and a portion of the protruding portion 40 may be joined to each other. In addition, the protruding portion 20 and the protruding portion 40 do not need to be formed at positions where they face each other.

Figure 10:
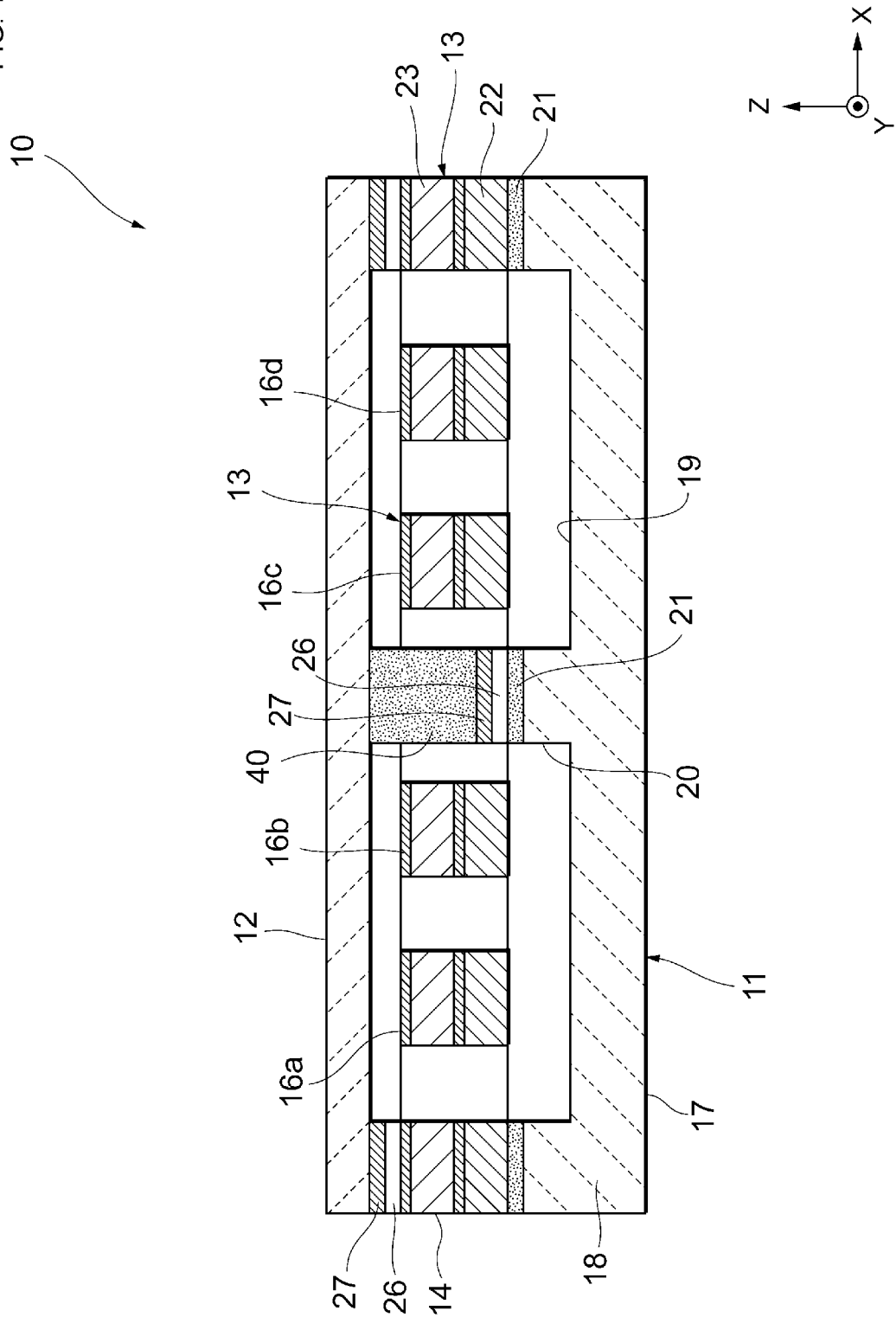
FIG. 10 is a cross-sectional view schematically illustrating the structure of a resonance device according to a fourth embodiment.

In the third embodiment illustrated in FIG. 9, the protruding portion 40 of the upper substrate 12 is formed integrally with a Si layer having a flat plate-like shape. In a fourth embodiment illustrated in FIG. 10, instead of employing the above structure, the protruding portion 40 may be formed of, for example, silicon oxide on the inner surface of the upper substrate 12. In other words, the protruding portion 40 may be formed of a material the same as the material of the upper substrate 12 or may be formed of a material different from the material of the upper substrate 12. In addition, in the resonance device 10 of the exemplary embodiment, the protruding portion 40 may only be formed on the upper substrate 12 by omitting formation of the protruding portion 20 on the lower substrate 11. In this case, the protruding portion 40 may be joined to, for example, the inner surface of the lower substrate 11.

Figure 11:
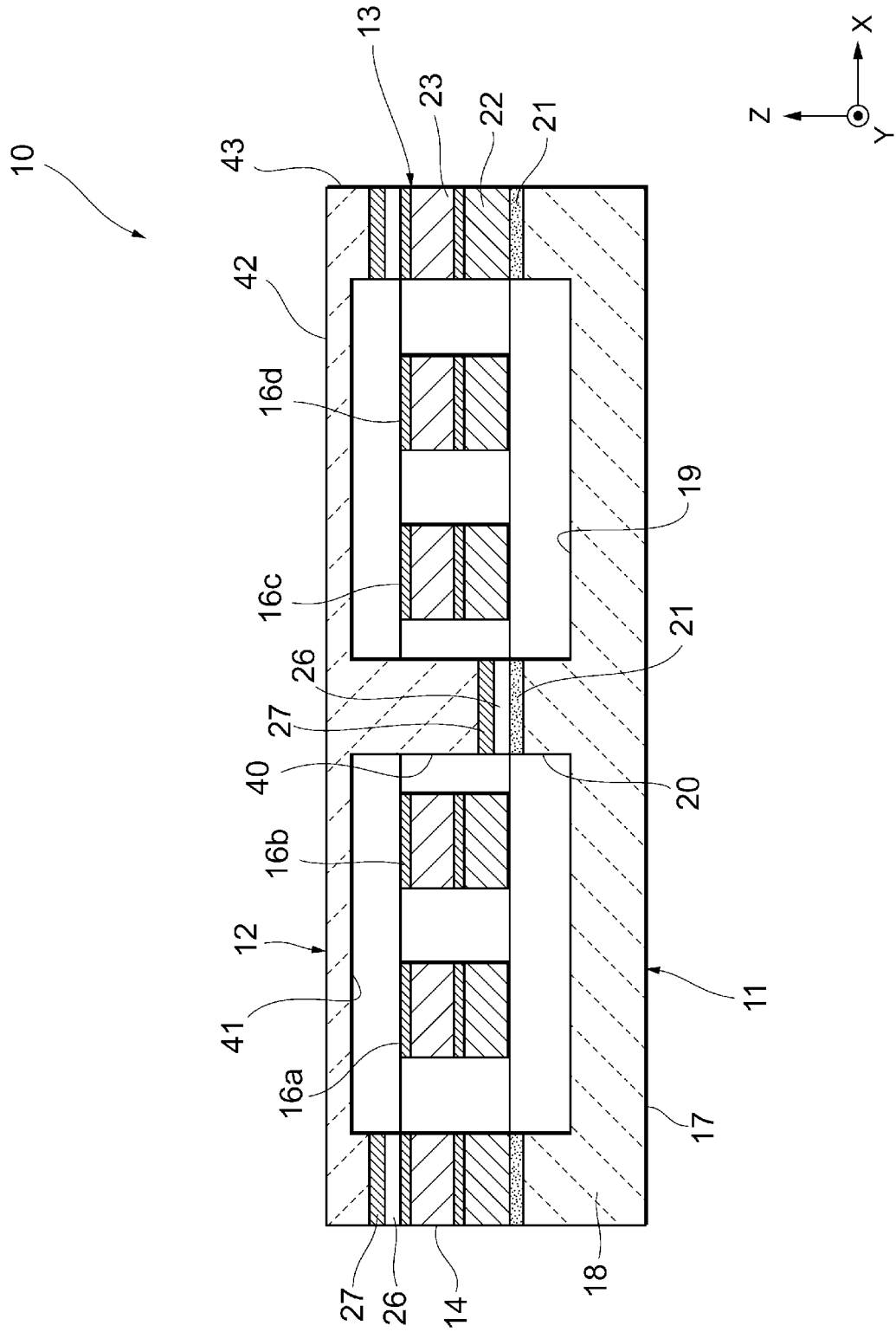
FIG. 11 is a cross-sectional view schematically illustrating the structure of a resonance device according to a fifth embodiment.

FIG. 11 is a cross-sectional view schematically illustrating the structure of a resonance device 10 according to a fifth embodiment. Similar to the third embodiment, in the resonance device 10, the protruding portion 20 and the protruding portion 40 are formed, and the difference from the structure according to the third embodiment is that a recess 41 is formed in the inner surface of the upper substrate 12. More specifically, the upper substrate 12 includes a bottom plate 42 extending along the XY plane so as to have a flat plate-like shape and a side wall 43 standing upright from the peripheral edge portion of the bottom plate 42. A surface of the bottom plate 42 corresponds to the inner surface of the upper substrate 12.

In the above-described resonance device 10, for example, by forming a recess 19 in the lower substrate 11, and in addition, forming the recess 41 in the upper substrate 12, the size of the vibration space of the vibration arms 16a to 16d in the vertical direction can be further increased. As a result, even if the amplitude of vibration of the vibration arms 16a to 16d is increased, the vibration arms 16a to 16d, the lower substrate 11, and the upper substrate 12 can be prevented from coming into contact with each other. Therefore, stable vibration of the vibration arms 16a to 16d can be realized.

Figure 12:
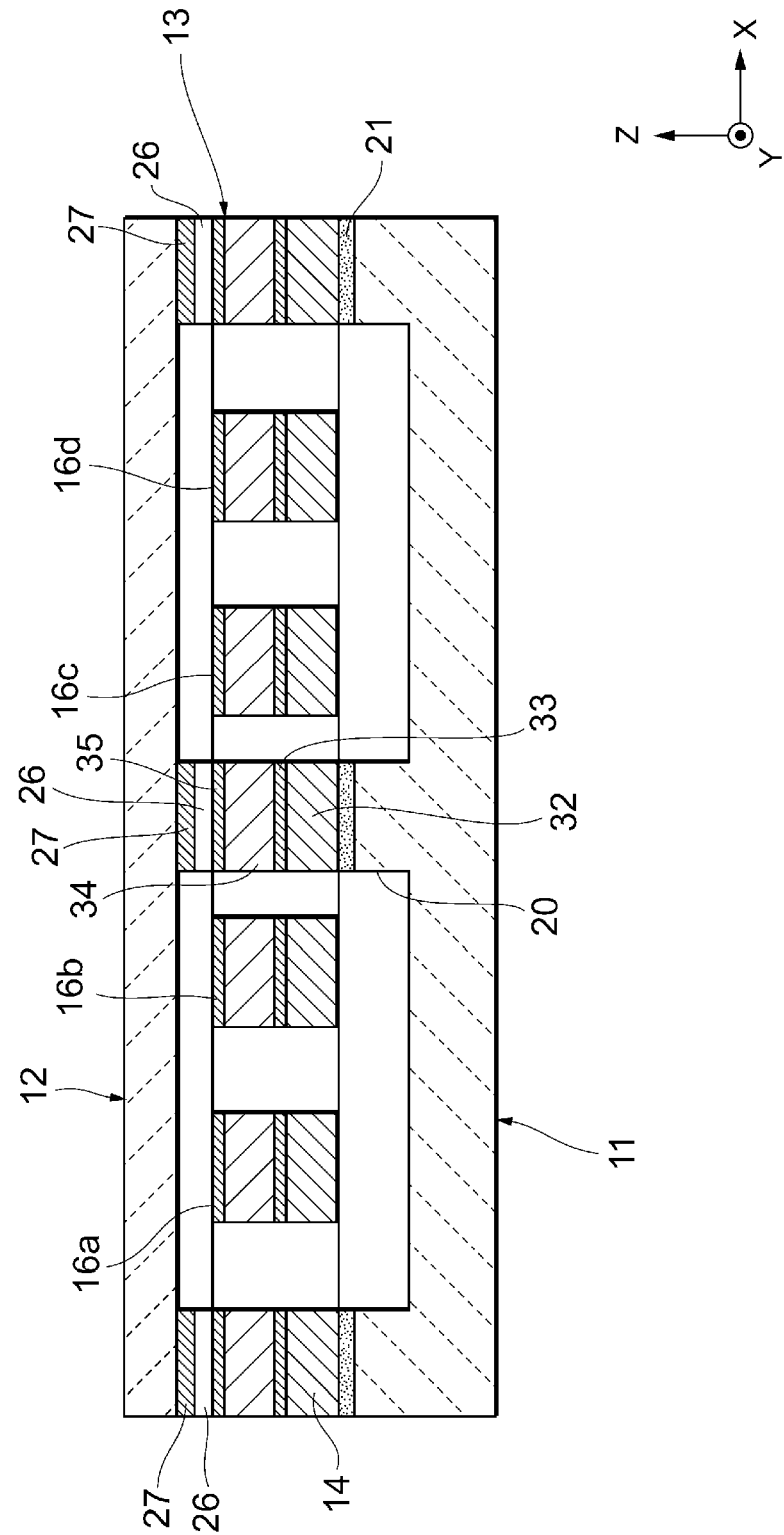
FIG. 12 is a cross-sectional view schematically illustrating the structure of a resonance device according to a sixth embodiment.

FIG. 12 is a cross-sectional view schematically illustrating the structure of a resonance device 10 according to a sixth embodiment. In the resonance device 10, the protruding portion 20 is connected to the inner surface of the upper substrate 12. The protruding portion 20 is formed by etching the degenerate Si substrate 32, the first Mo film 33, the AlN film 34 and the second Mo film 35 so as to leave the protruding portion 20 at the position on the lower substrate 11 at which the protruding portion 20 is to be formed. The protruding portion 20 is connected to the upper substrate 12 by the Au film 26 and the Sn film 27. According to the above-described configuration, the lower substrate 11 and the upper substrate 12 are connected to each other by the protruding portion 20, and thus, the rigidity of the substrates can be further improved.

FIG. 13 is a cross-sectional view schematically illustrating the structure of a resonance device 10 according to a seventh embodiment. As shown, in the resonance device 10, the vibration arms 16a to 16d are formed with the same gap (e.g., about 30 μm) therebetween, and protruding portions 20A to 20C, each of which is similar to the protruding portion 20 according to the sixth embodiment, are respectively formed in the gaps between the vibration arms 16a to 16d. The protruding portion 20A is formed at a position facing the gap between the outer vibration arm 16a and the inner vibration arm 16b on the bottom plate 17 and is connected to the inner surface of the upper substrate 12. The protruding portion 20B is formed at a position facing the gap between the inner vibration arms 16b and 16c on the bottom plate 17 and is connected to the inner surface of the upper substrate 12. The protruding portion 20C is formed at a position facing the gap between the outer vibration arm 16d and the inner vibration arm 16c on the bottom plate 17 and is connected to the inner surface of the upper substrate 12. According to the above-described configuration, the lower substrate 11 and the upper substrate 12 are connected to each other by the protruding portions 20A to 20C, and thus, the rigidity of the substrates can be further improved.

It is noted that the embodiments have been described above for ease of understanding of the present invention and are not intended to limit the scope of the present invention. Changes and improvements may be made to the present embodiments within the scope of the invention, and the present invention includes equivalents thereof. In other words, design changes may be suitably made to the embodiments by those skilled in the art, and such embodiments are also within the scope of the present invention as long as they have the features of the present invention. For example, the elements included in the embodiments and the arrangements, materials, conditions, shapes, sizes and the like of the elements are not limited to those described above as examples, and they may be suitably changed. In addition, the elements included in the embodiments can be combined with each other as long as it is technically possible, and such combinations are also within the scope of the present invention as long as the combinations have the features of the present disclosure.

REFERENCE SIGNS LIST 10 resonance device
11 lower substrate
12 upper substrate
13 resonator
15 base portion
16a to 16d vibration arm
19 recess
20 protruding portion (lower protruding portion)
40 protruding portion (upper protruding portion)
41 recess
42 bottom plate
43 side wall

The invention claimed is:

1. A resonance device comprising:
a lower substrate and an upper substrate that define a vibration space therebetween;
a protruding member disposed on an inner surface of one of the lower substrate or the upper substrate and that protrudes in the vibration space; and
a resonator disposed in the vibration space and including a base and a plurality of vibration arms that extend in parallel to each other from the base,
wherein each of the plurality of vibration arms is configured to vibrate in an out-of-plane bending vibration mode in a vertical direction of the resonator device towards at least one of the inner surface of the lower substrate and the inner surface of the upper substrate
wherein the plurality of vibration arms comprises four vibration arms with the protruding member facing a gap between an inner two of the four vibration arms, which are disposed between an outer two of the four vibration arms,
wherein the gap between the inner two vibration arms has a width that is equal to or larger than a width of a gap between one of the outer vibration arms and the adjacent inner vibration arm, and
wherein each of the four vibration arms comprises first and second electrodes with a piezoelectric layer disposed therebetween, with the first and second electrodes of each vibration arm setting an electric field for the inner two vibration arms to be opposite of an electric field of the outer two vibration arms, such that the inner two vibration arms are displaced in a same direction as each other and in an opposite direction as the outer two vibration arms.

2. The resonance device according to claim 1, wherein the plurality of vibration arms extend in a direction along the inner surface of the lower substrate or the inner surface of the upper substrate.

3. The resonance device according to claim 1, wherein a surface of the protruding member that is parallel to the inner surface of at least one of the lower substrate and the upper substrate faces a gap between two of the plurality of vibration arms.

4. The resonance device according to claim 1, wherein the width of the gap between the one outer vibration arm and the adjacent inner vibration arm is equal to a width of a gap between a second of the outer vibration arms and the adjacent inner vibration arm.

5. The resonance device according to claim 1, wherein at least one of the lower substrate and the upper substrate includes a bottom plate that includes the inner surface and a side wall extending from the bottom plate to form a recess with the bottom plate.

6. The resonance device according to claim 5, wherein the protruding member is disposed in the recess and at least one end of the protruding member is connected to the side wall.

7. The resonance device according to claim 1, wherein the protruding member includes a lower protruding member disposed on the inner surface of the lower substrate and an upper protruding member disposed on the inner surface of the upper substrate.

8. The resonance device according to claim 7, wherein the lower protruding member is connected to the upper protruding member.

9. The resonance device according to claim 1, wherein at least one end of the protruding member disposed on the inner surface of the lower substrate is connected to the inner surface of the upper substrate.

10. The resonance device according to claim 1, wherein at least one end of the protruding member disposed on the inner surface of the upper substrate is connected to the inner surface of the lower substrate.

11. The resonance device according to claim 1, further comprising at least two additional protruding members that are each disposed on at least one of the inner surface of the lower substrate or the upper substrate and that each protrude in the vibration space.

12. The resonance device according to claim 11,
wherein the protruding member faces a gap between the inner two of the four vibration arms, which are disposed between the outer two of the four vibration arms, and
wherein each of the additional protruding members faces a gap between one of the outer vibration arms and the adjacent inner vibration arm, respectively.

13. A resonance device comprising:
a lower substrate and an upper substrate that define a vibration space therebetween, the lower and upper substrates each comprising a rectangle shape with a pair of first sides and a pair of second sides perpendicular to the first sides that have a shorter length than the first sides;
a protruding member disposed on an inner surface of one of the lower substrate or the upper substrate and that protrudes in the vibration space, the protruding member having a length extending in a first direction parallel to the first sides of each of the upper and lower substrates; and
a resonator disposed in the vibration space and including a base and a plurality of vibration arms that extend in parallel to each other from the base in the first direction,
wherein each of the plurality of vibration arms is configured to vibrate in an out-of-plane bending vibration mode in a vertical direction of the resonator device towards at least one of the inner surface of the lower substrate and the inner surface of the upper substrate, and
wherein the plurality of vibration arms each comprise first and second electrodes with a piezoelectric layer disposed therebetween, with the first and second electrodes of each vibration arm setting an electric field for an inner pair of the vibration arms to be opposite of an electric field of an outer pair of the vibration arms, such that the pair is displaced in a same direction as each other and in an opposite direction as the outer pair of vibration arms.

14. The resonance device according to claim 13, wherein the protruding member faces a gap between two of the plurality of vibration arms.

15. The resonance device according to claim 14,
wherein the plurality of vibration arms comprises four vibration arms, and
wherein the protruding member faces a gap between the inner pair of the four vibration arms, which are disposed between the our pair of the four vibration arms.

16. The resonance device according to claim 15, wherein the gap between the inner pair of vibration arms has a width that is equal to or larger than a width of a gap between one of the outer pair of vibration arms and the adjacent inner vibration arm.

17. The resonance device according to claim 13,
wherein the protruding member includes a lower protruding member disposed on the inner surface of the lower substrate and an upper protruding member disposed on the inner surface of the upper substrate, and
wherein the lower protruding member is connected to the upper protruding member.

* * * * *